United States Patent [19]

Banks et al.

[11] 4,344,996

[45] Aug. 17, 1982

[54] SURFACE TEXTURING OF FLUOROPOLYMERS

[75] Inventors: Bruce A. Banks, Olmsted Township, Lorain County; Michael J. Mirtich, N. Olmsted; James S. Sovey, Strongsville, all of Ohio

[73] Assignee: The United States of America as represented by the Administrator of the National Aeronautics and Space Administration, Washington, D.C.

[21] Appl. No.: 218,588

[22] Filed: Dec. 19, 1980

[51] Int. Cl.$^3$ .................... B32B 27/16; C23C 15/00; C23F 1/00
[52] U.S. Cl. ................................ 428/141; 204/38 B; 204/192 E; 204/192 EC
[58] Field of Search .......... 204/192 E, 192 EC, 38 B; 156/643; 428/141

[56] References Cited

U.S. PATENT DOCUMENTS

| | | | |
|---|---|---|---|
| 4,056,395 | 11/1977 | Sato et al. | 96/36 |
| 4,064,030 | 12/1977 | Nakai et al. | 204/192 E |
| 4,073,669 | 2/1978 | Heinecke et al. | 156/643 |
| 4,092,210 | 5/1978 | Hoeptner | 156/643 |
| 4,160,045 | 7/1979 | Longshore | 427/38 |
| 4,199,650 | 4/1980 | Mirtich et al. | 428/421 |

FOREIGN PATENT DOCUMENTS 2036627A 7/1980 United Kingdom ......... 204/192 EC

Primary Examiner—Aaron Weisstuch
Attorney, Agent, or Firm—Norman T. Musial; John R. Manning; Gene E. Shook

[57] ABSTRACT

This invention is concerned with providing improved surface texturing for adhesive bonding, metal bonding, substrate plating, decal substrate preparation, and biomedical implant applications. The invention is particularly concerned with epoxy bonding to polymers that typically exhibit low adhesion and bonding metals to a desired thickness to a polymer substrate.

The surface 12 to be bonded is first dusted in a controlled fashion to produce a disbursed layer of fine mesh particles 14 which serve as masks. The surface texture is produced by impinging gas ions on the masked surface. The textured surface takes the form of pillars or cones.

The bonding material, such as a liquid epoxy, flows between the pillars which results in a bond having increased strength. For bonding metals a thin film of metal is vapor or sputter deposited onto the textured surface. Electroplating or electroless plating is then used to increase the metal thickness to the desired amount.

14 Claims, 3 Drawing Figures

SURFACE TEXTURING OF FLUOROPOLYMERS

ORIGIN OF THE INVENTION

The invention described herein was made by employees of the U.S. Government and may be manufactured and used by or for the Government for governmental purposes without the payment of any royalties thereon or therefor.

TECHNICAL FIELD

This invention is concerned with preparing the surface of a low adhesion substrate, such as a fluoropolymer, for either adhesion bonding or metallizing. One such polymeric material is polytetrafluoroethylene, known commercially as Teflon. This fluoropolymer is presently used in both ground and space applications. Many polymers exhibit low adhesion characteristics. By way of example, untreated Teflon exhibits an epoxy bond tensile strength of less than 180 psi.

Chemical etching of fluorocarbon polymers significantly increases the bond strength. However, chemical etchant shelf life is relatively short, and the bond must be made immediately after the application of the chemical treatment to obtain maximum bond strength. Also chemical etching of polymers may not be acceptable for certain applications, such as biomedical implants, because of potential surface contamination.

When polymeric materials are to be used in solar absorbers for heating and cooling applications, various methods have been proposed for the surface preparation. Among these procedures are painting, electrochemical plating, evaporated or sputtered coating, and etching surface micropores or grooves. In fusion bonding of a polymer to a metal, the polymer is heated, and the polymer can change its basic physical and optical properties.

BACKGROUND ART

U.S. Pat. No. 4,064,030 to Nakai describes a process which employs RF sputtering of polymers without masking. The surface texture, resulting from the sputtering, is controlled only by the chemical nature of the substrate, RF forward power density, and etch time. This process is referred to as natural texturing.

Hoepfner U.S. Pat. No. 4,092,210 described the photolithographic process which utilizes layers or laminates for masking purposes. The masked material is removed by ion bombardment.

DISCLOSURE OF INVENTION

According to the method of the present invention, a disbursed layer of fine mesh particles is applied to the surface of a polymer in a controlled fashion to produce masks. The particles are applied by dusting, brushing, or more sophisticated techniques, such as those used for microvoid latex coatings. The masked surface is then treated by impinging gas ions on the surface. The resultant textured surface takes the form of pillars whose vertical dimensions may range from tens to hundreds of microns, depending on the selection of the beam energy, ion current density, and etch time. After ion beam processing the masked particles are removed by washing or dissolving.

BRIEF DESCRIPTION OF THE DRAWING

Details of the invention will be described in connection with the accompanying drawings wherein.

BEST MODE FOR CARRYING OUT THE INVENTION

Figure 1:
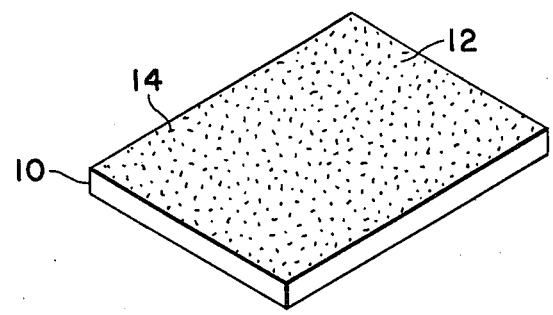
FIG. 1 is a perspective view of a surface of a polymer dusted in accordance with the invention prior to ion beam texturing.
Figure 2:
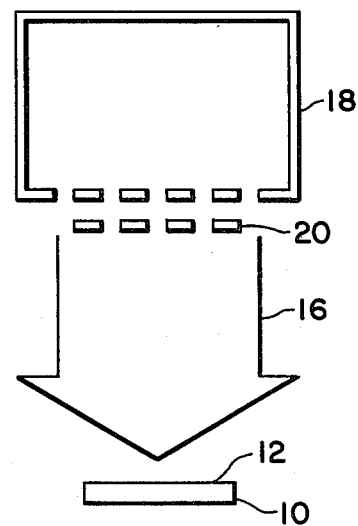
FIG. 2 is a schematic view of the ion beam texturing apparatus used to texture the surfaces of the polymer.

Referring to the drawing, there is shown in FIG. 1 a substrate 10 of a polymeric material, such as a fluoropolymer, having a surface 12 which is to be prepared for epoxy bonding. The substrate 10 may be any of a number of polymeric materials which may exhibit low adhesion characteristics.

According to the present invention the surface 12 is covered with a disbursed layer of fine mesh particles 14. The preferred particles 14 are of a sputter-resistant material, such as tungsten, molybdenum, carbon, or tantalum. Almost any metal particle can be used as a mask for polymers inasmuch as the metal sputter yield is usually a few orders of magnitude lower than that of the polymer. Fine ground NaCl and $SiO_2$ also have been used as masks.

The particles 14 are randomly disbursed over the surface 12 in a controlled fashion to form masks. In order to provide for the development of a satisfactory surface microstructure, the particles 14 have diameters in the range between 0.1 $\mu$m and 10 $\mu$m.

The particles 14 can be applied to the surface 12 by dusting. These particles have also been sprayed onto the surface 14 using a water and particle slurry. The spray is in the form of a fine mist, and as the water evaporates the particles 14 have a tendency to stick to the surface 12. The particles 14 also have adhered to the substrate 10 by pressing them onto the surface 12 by rolling or direct pressure.

After the surface 12 of the substrate 10 has been covered by the random particles 14 the surface is exposed to a vertical beam 16 of ions in a manner described in U.S. Pat. No. 4,199,650. This beam 16 is preferably from an electron bombardment ion source 18 of the type developed from electric propulsion technology. Such an ion source is described in "Advances in Electronics and Electron Physics" by H. R. Kaufman, vol. 36, pages 365–373. Beam extraction is accomplished by a dished, two-grid ion optics system 20. Such a system is described in AIAA Paper No. 76-1017 entitled "A 30 cm Diameter Argon Ion Source". Neutralization of the ion beam 16 can be achieved by secondary electrons released by ion bombardment of the vacuum facility walls or by use of a neutralizer.

The electron bombardment ion source 18 is located in the vacuum facility (not shown) which is sufficiently large to minimize back sputtered facility material from contaminating the substrate 10. The vacuum facility is maintained at a pressure of about $4 \times 10^{-5}$ torr during the operation of the ion source 18.

The substrate 10 is positioned normal to the ion beam 16 at a location of about 20 centimeters from the ion source 18. The masked surface 12 is totally within the ion beam 16.

The current density at the surface 12 is between about 0.1 mA/cm² and 1.0 mA/cm² depending upon the thermal integrity of the polymers and the duration of exposure. The vertical beam 16 is uniform over the surface 12 of the substrate 10 and has an energy in the 200 eV to 2000 eV range. The etch time may range from seconds to hours, depending on the surface roughening desired.

Figure 3:
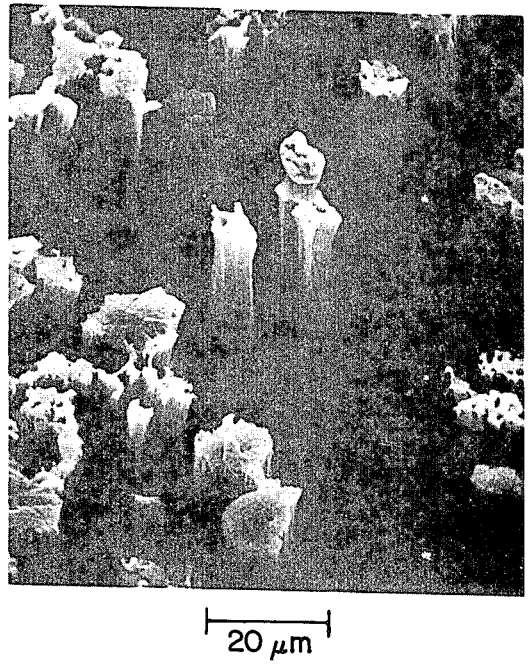
FIG. 3 is a photomicrograph of a fluoropolymer surface that has been ion beam textured using fine mesh copper particles as masks.

The resultant surface roughening or texturing of the surface 12 takes the form of pillars whose cross-section is similar to the dimensions of the masking particles 14 as shown in FIG. 3. The vertical dimensions of these pillars may range from tenths to hundreds of microns, depending on the selection of beam energy, ion current density, etch time, and polymeric materials.

After ion beam processing, the substrate 10 is removed from the vacuum facilities. The particles 14 are then removed by washing or being dissolved. The textured polymer surface has superior characteristics for certain application such as writing or printing, decal applications, and bonding using adhesive tapes. The tape is applied to the textured polymer surface or the adhesive of the polymer tape is attached by ion beam texturing of the tape.

Polymers textured in accordance with the invention may be used for biomedical applications, such as soft tissue implants. Biocompatible, water soluble masking particles such as certain soluble salts are preferably used during the texturing process for these biomedical applications.

A fluorocarbon polymer, known commercially as Teflon, was ion beam textured in accordance with the invention. The material was bonded using an epoxy bonding material in the form of a two part fluid that ws not viscous. The bonded joints had tensile yield strengths in excess of 2,000 psi. Also, ion beam textured surfaces produced stronger bond joints than those produced by chemical etch processes.

The process is superior to naturally ion etched polymers inasmuch as the vacuum processing times are reduced. Referring to FIG. 3, the fluoropolymer features produced by natural texturing are only about one tenth the height of the pillars. This process is capable of producing textured surfaces on polymers which do not yield significant structure upon ion etching. Moreover, thermal control of the polymer environment is easily obtained with the ion beam system.

A metal may be bonded to the surface 12 to a desired thickness by first depositing a thin film of the metal either by sputtering or evaporation techniques. This film has a thickness of about 1000 Å.

This process bonds the metal to the etched surface of the polymer without using an adhesive. The metal thickness is then increased by electroplating. This increase in thickness may be a few mils or greater. It is contemplated this metallization may be done using any metal that can be deposited by sputtering or vapor deposition and then electro- or electroless plated.

While a preferred embodiment of the invention has been described, it is contemplated that various modifications may be made without departing from the spirit of the invention or the scope of the subjoined claims.

We claim:

1. A method of treating the surface of a fluoropolymer for improved bonding without altering the chemistry of the same, comprising the steps of applying a layer of randomly disbursed fine mesh particles of a sputter-resistant material having diameters in the range between about 0.1 μm and 10 μm to said surface thereby masking the same, placing said fluoropolymer in a vacuum environment of about $4 \times 10^{-5}$ torr, exposing said masked surface to a beam of ions having an ion beam current density between 0.1 mA/cm² and 1.0 mA/cm² to texture the same, moving said fluoropolymer from said vacuum environment to ambient pressure, and removing said masking particles from said textured surface.

2. A method of treating the surface of a fluoropolymer as claimed in claim 1 wherein said masking particles are made of a material selected from the group consisting of tungsten, molybdenum, carbon and tantalum.

3. A method of treating the surface of a fluoropolymer as claimed in claim 2 wherein the fluoropolymer is polytetrafluoroethylene.

4. A method of treating the surface of a fluoropolymer as claimed in claim 1 wherein said masking particles are applied to said surface of said fluoropolymer by dusting.

5. A method of treating the surface of a fluoropolymer as claimed in claim 1 wherein said masking particles are applied to said surface of said fluoropolymer by spraying.

6. A method of treating the surface of a fluoropolymer as claimed in claim 1 wherein said masking particles are applied to said surface of said fluoropolymer by direct pressure.

7. A method of treating the surface of a fluoropolymer for biomedical applications as claimed in claim 1 wherein said masking particles are biocompatible soluble salts.

8. A method of treating the surface of a fluoropolymer as claimed in claim 1 wherein said masking particles are removed from said textured surface by washing the same.

9. A method of treating the surface of a fluoropolymer as claimed in claim 1 wherein the masking particles are dissolved to remove them from said textured surface.

10. A method of treating the surface of a fluoropolymer as claimed in claim 1 including the step of depositing a thin film of metal onto said textured surface subsequent to removing said masking particles therefrom.

11. A method of treating the surface of a fluoropolymer as claimed in claim 10 wherein the metal film is deposited to a thickness of about 1000 Å.

12. A method of treating the surface of a fluoropolymer as claimed in claim 11 wherein said metal film is deposited by sputtering.

13. A method of treating the surface of a fluoropolymer as claimed in claim 12 wherein the thickness of the metal film is increased by electroplating additional metal.

14. A fluoropolymer treated according to the process of claim 1.

* * * * *